United States Patent [19]
Bradford et al.

[11] Patent Number: 5,726,999
[45] Date of Patent: Mar. 10, 1998

[54] METHOD AND APPARATUS FOR UNIVERSAL PROGRAMMABLE BOUNDARY SCAN DRIVER/SENSOR CIRCUIT

[75] Inventors: William F. Bradford, Cedar Park; Richard J. Glass, Austin, both of Tex.

[73] Assignee: Texas Instruments Incorporated, Dallas, Tex.

[21] Appl. No.: 725,839

[22] Filed: Sep. 30, 1996

Related U.S. Application Data

[63] Continuation of Ser. No. 177,784, Jan. 5, 1994, abandoned, which is a continuation of Ser. No. 711,490, Jun. 6, 1991, abandoned.

[51] Int. Cl.$^6$ .............................................. G01R 31/3185
[52] U.S. Cl. ...................................................... 371/22.32
[58] Field of Search ............................................. 371/22.3

[56] References Cited

U.S. PATENT DOCUMENTS 5,260,948  11/1993  Simpson et al. .................. 371/22.3

OTHER PUBLICATIONS

LeBlanc, J., "LOCST: A Built–In Self–Test Technique", IEEE Design & Test, pp. 45–52, Nov. 1984.
A Standard Test Bus and Boundary Scan Architecture, Lee Whetsel; Texas Instruments Technical Journal, Jul.–Aug. 1988, vol. 5., No. 4, pp. 48–59.
Turino, J., *Design to Test*, 2nd ed., Van Nostrand Reinheld, 1990, pp. 185–220.

*Primary Examiner*—Stephen M. Baker
*Attorney, Agent, or Firm*—Warren L. Franz; Mark E. Courtney; Richard L. Donaldson

[57] ABSTRACT

A circuit and technique is described for adding boundary scan test capability to circuit boards and systems, thereby improving the ability to test and verify proper operation of such systems using nonintrusive methods. An integrated circuit consisting of a serial path of input/output buffers, an instruction register, and a serial test access port circuit is described. The integrated circuit can be coupled to a number of input and output signals, and the serial test bus is then used in conjunction with the test access port and instruction register circuitry to observe or control any or all of the signals present at the pins of the integrated circuit. Each pin may be programmed as an input or output for a particular operation. Because the integrated circuit is programmable and can be applied to any system, the need for design of special test hardware is eliminated, and the user may build in boundary scan capability into any arbitrary system. This is of particular importance when adding test capability to systems comprised of an array of off-the-shelf components, many of which do not have these capabilities.

22 Claims, 5 Drawing Sheets

| COMMAND | CODE |
| --- | --- |
| EXTEST | 00 |
| SAMPLE/PRELOAD | 01 |
| ASSERT AND BYPASS | 10 |
| BYPASS | 11 |

METHOD AND APPARATUS FOR UNIVERSAL PROGRAMMABLE BOUNDARY SCAN DRIVER/SENSOR CIRCUIT

This application is a continuation of application Ser. No. 08/177,784, filed Jan. 5, 1994 now abandoned; which is a continuation of application Ser. No. 07/711,490, filed Jun. 6, 1991, now abandoned.

(C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention relates generally to integrated circuits utilizing boundary scan testability technology and applications of boundary scan circuits and techniques in applications such as circuit board design using high density technologies like surface mount technology (SMT), application specific integrated circuits (ASICs), programmable integrated circuits and systems.

BACKGROUND OF THE INVENTION

It is often desirable to provide improved accessibility to specific areas of an integrated circuit or a group of integrated circuits installed in a surface mount technology (SMT) or other high density environment (TAB, PCB) that allows the user to test and verify proper operation of a particular IC or path without any modification of the hardware or additional physical connections to the circuits or to the system the circuits reside in. The test access hardware should not affect the normal operation of the circuits or create additional delays or performance problems, and should be done non-intrusively so that the individual integrated circuits and the system can be tested while installed in an operational environment. The need for this kind of testability access led to the development of boundary scan techniques which allow access to the pins of the integrated circuits without intrusive test hardware. The need to test integrated circuits manufactured by different vendors in a system environment further led to the development of a standard testability bus for boundary scan applications, the JTAG (Joint Test Action Group) standard bus. The JTAG bus is now governed by IEEE standard 1149.1.

A designer who wishes to build boundary scan testing into a circuit board, integrated circuit or system and use the JTAG bus must first implement the boundary scan path and configure it for the particular application or system. This task becomes particularly difficult when the designer intends to use memories or other off-the-shelf components which are not JTAG compatible. The high cost of designing hardware or a custom integrated circuit for a particular application, coupled with the amount of time required to design, test and fabricate such hardware or customized integrated circuits creates a need for a general purpose, universal, programmable integrated circuit device which can be used to implement and test boundary scan paths using the JTAG bus for any application.

Without limiting the scope of the invention, its background is described in connection with boundary scan techniques used to test and communicate with integrated circuit devices (ICs) not having built in boundary scan capabilities. Although the particular embodiment presupposes the use of the JTAG standard bus, alternative communication arrangements can be used, as will be obvious to one experienced in the art.

Heretofore, in this field, various boundary scan techniques have been used by system designers. However, each designer has had to implement a scan bus specifically designed for each application. The time and cost of designing, testing and manufacturing hardware or custom integrated circuits for each system is prohibitive. Further, the use of several different systems in one operating environment, each system having a different boundary scan methodology, results in reduced capability and creates a need for additional translation hardware or bus couplers which require additional design and test time and may reduce overall system performance.

SUMMARY OF THE INVENTION

Generally, and in one form of the invention, a programmable integrated circuit consisting of a plurality of input/output buffers each coupled to an I/O pin control circuit, the I/O pin control circuits being serially coupled to provide scan path access to the entire plurality of I/O pin control circuits and pins, a bypass circuit to provide a method for communicating to other programmable integrated circuits serially coupled without affecting the normal non-test operations in progress, an instruction decoding block which receives serial data and commands from a JTAG bus, decodes a set of instructions and in response controls the input/output buffers and bypass logic, and a JTAG Test Access Port circuit which couples the integrated circuit to a standard JTAG bus is described.

Each I/O pin (64 in the described implementation) provided by the device is independently programmable, so that the device can be used in test applications to drive and sense test vector data to or from the device under test. Each I/O pin has two associated boundary scan bits, to allow the output driver to be configured as either enabled or disabled and the logic level asserted to be either a logic 1 or logic 0 for each pin. A reset state where all drivers are configured in tri-state mode is provided to prevent clashes with the unit under test at power up or during initial programming.

The device architecture may also be embedded in application logic to provide testability functions in areas of otherwise low JTAG observability to improve testability.

Further embodiments disclosed herein involve using the boundary scan integrated circuit as part of a test fixture for testing integrated circuits or circuit boards. Multiple universal boundary scan driver/sensor ICs are serially interconnected until the required number of I/O pins is provided for connection to the device under test. This technique advantageously provides a method for rapidly constructing a test fixture for any device which is to be tested without additional hardware design or manufacturing overhead.

3

Figure 6A:
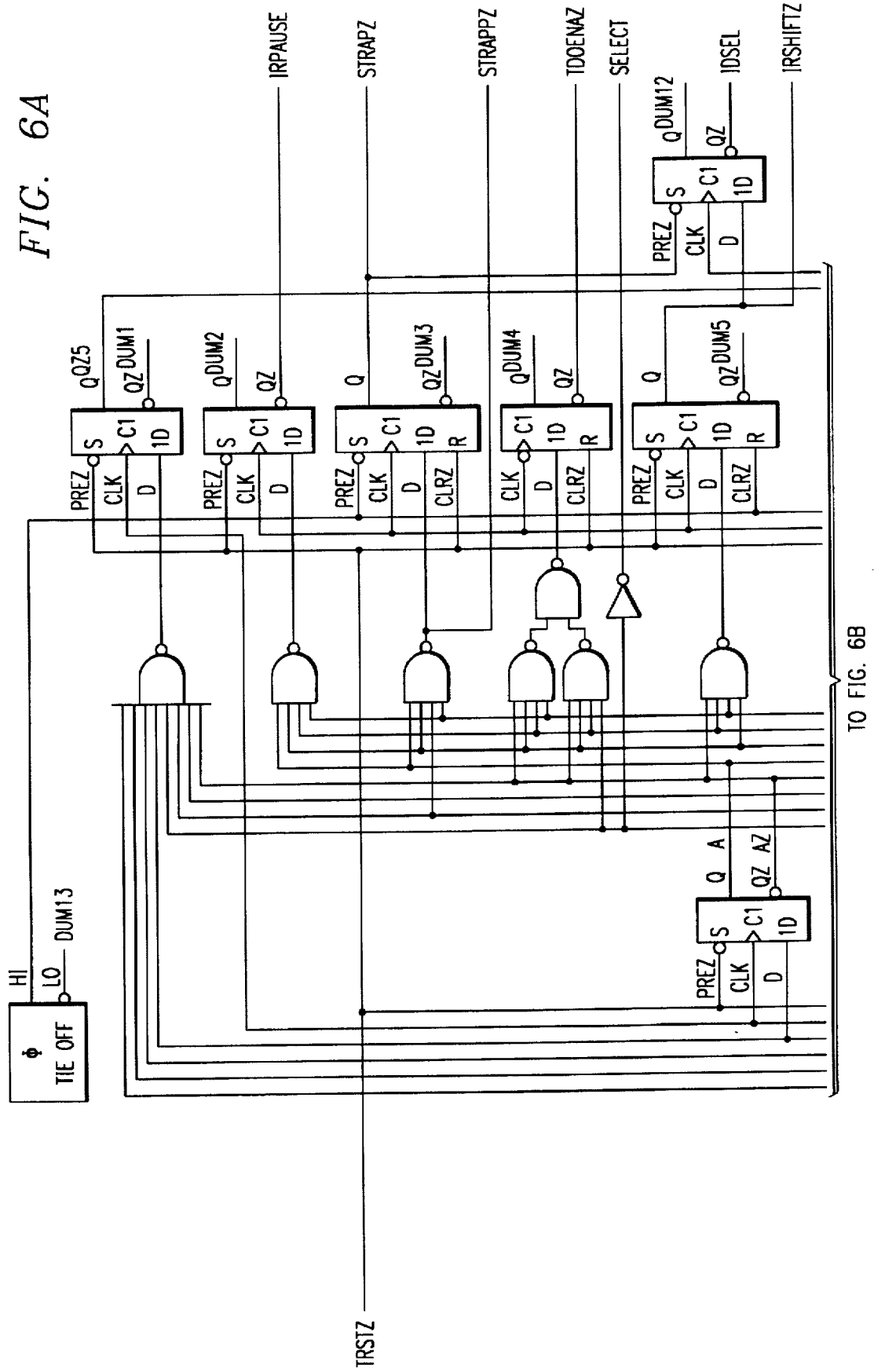
Figure 6B:
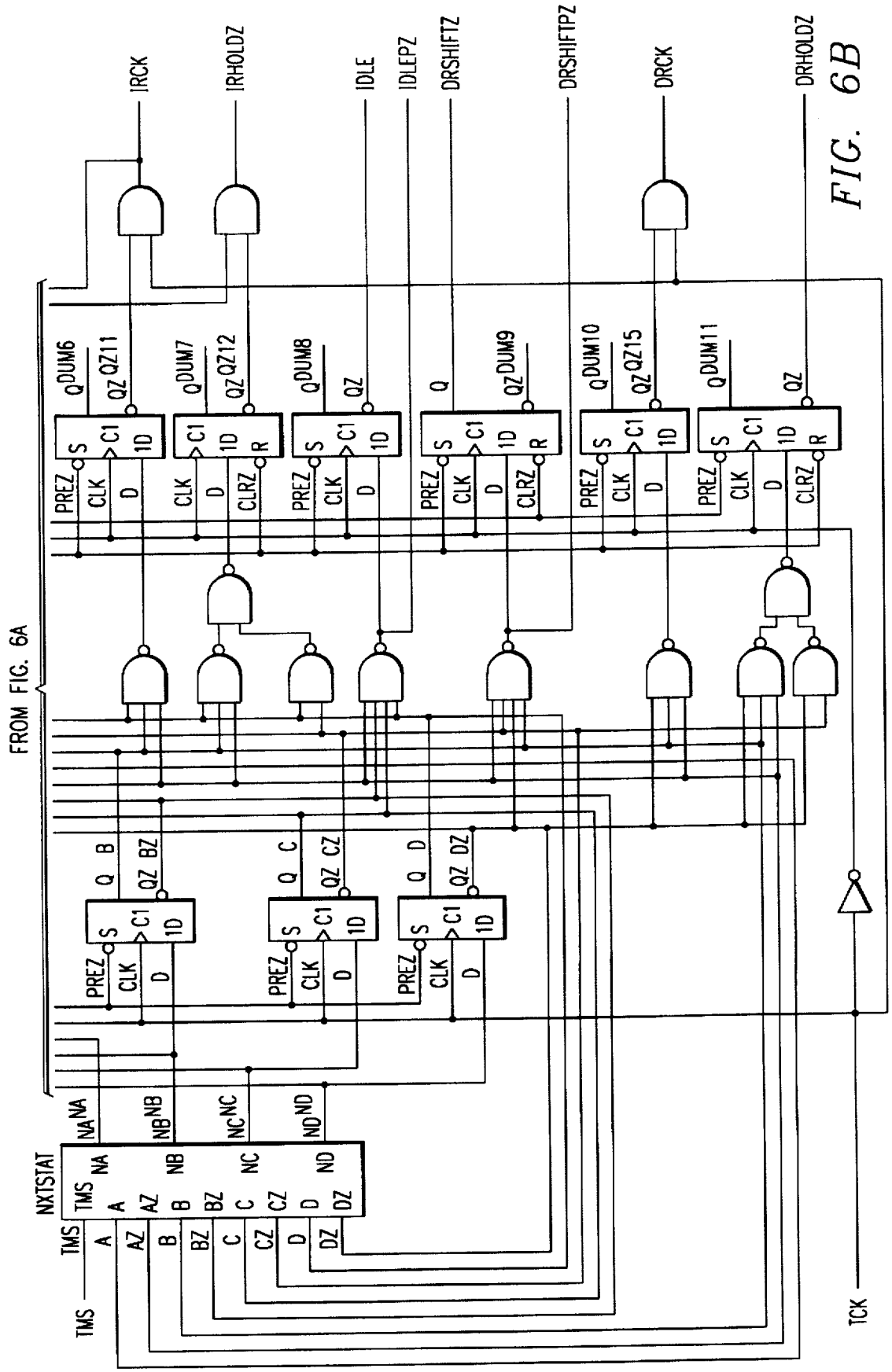

FIG. 6 is a diagram of the JTAG Test Access Port (TAP) circuitry; and

Figure 7:
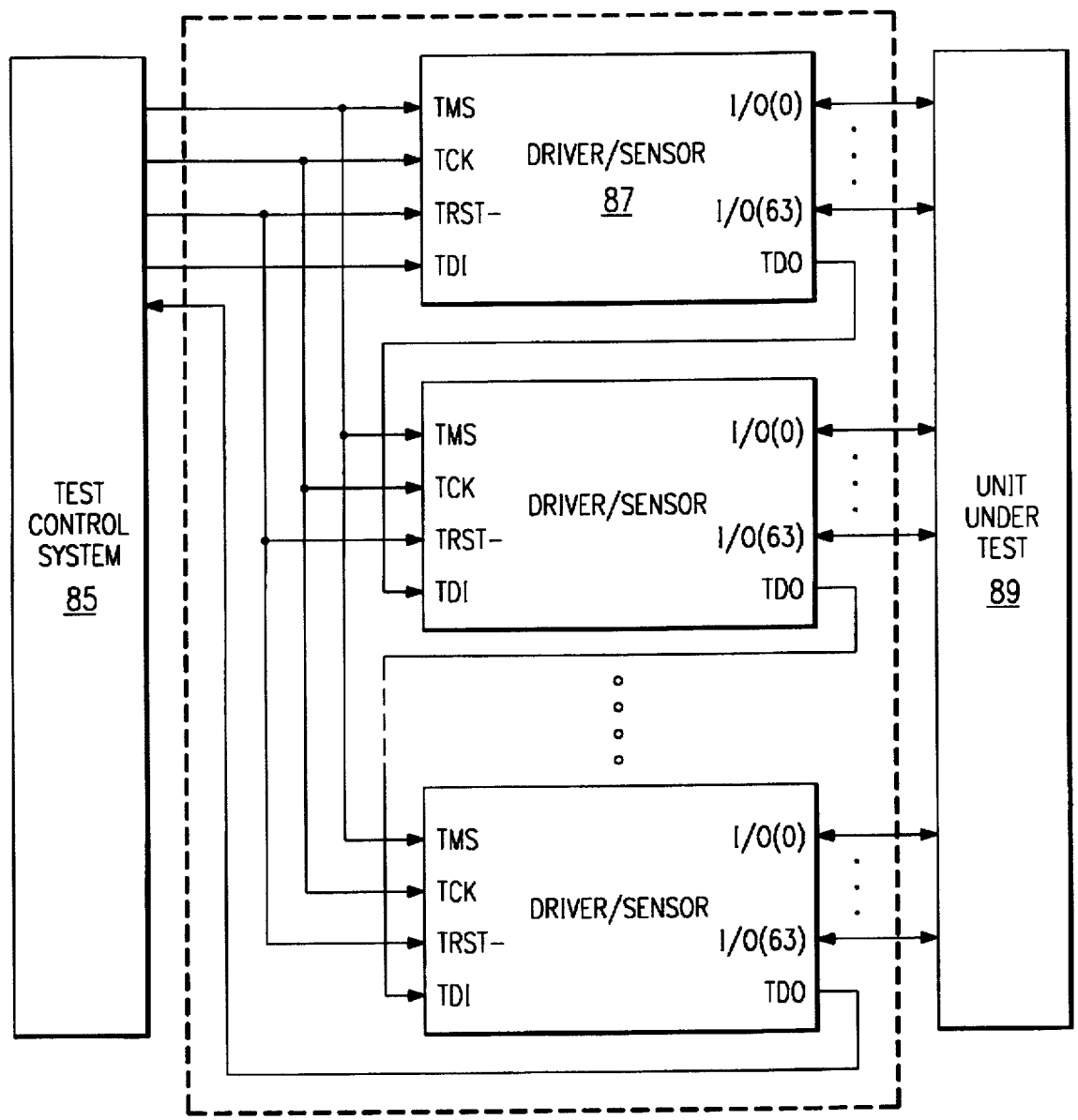

FIG. 7 is a block diagram of an application of the driver/sensor IC in a device test fixture.

Corresponding numerals and symbols in the different figures refer to corresponding parts, unless otherwise indicated.

DETAILED DESCRIPTION OF PREFERRED EMBODIMENTS

Figure 1:
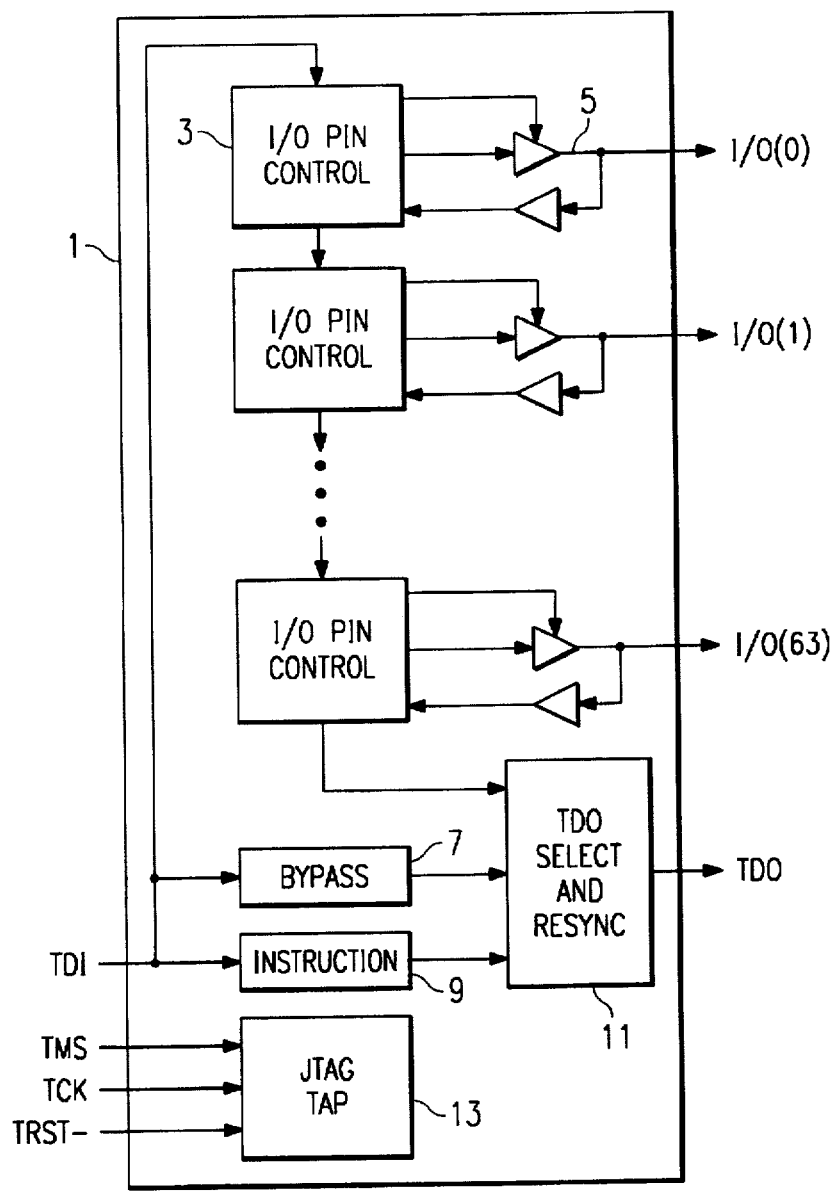
FIG. 1 is a block diagram of the Boundary Scan Driver/Sensor Device.

In FIG. 1, a diagram of an integrated circuit containing the boundary scan sensor/driver circuitry 1 is depicted. A plurality of I/O control circuits 3 is shown, each serially coupled to its nearest neighbors and each coupled to an I/O buffer 5 consisting of an input buffer, an output buffer with an enable line, and a pad. The output of the scan path leaves the highest ordered I/O control block (here, there are 64 by way of example, enumerated from 0 to 63) and is coupled to the Test Data Output (TDO) Select and Resync circuitry 11.

The JTAG bus is coupled to the JTAG Test Access Port (TAP) circuitry 13. The test data input signal from the JTAG bus, TDI, is coupled to the lowest ordered I/O control circuit 3, the Bypass circuitry 7, and the Instruction register circuitry 9.

In operation, the JTAG bus sends command and data messages by handshaking with the Boundary Scan Driver/ Sensor IC on the TMS, TRST_ and TCK lines. Commands are sent as serial data on the TDI line and shifted into the Instruction register 9 for decoding. The reader is referred to the JTAG Bus Specification, IEEE standard 1149.1, for details and timing of the transmission of commands and data on the JTAG bus.

Once a command is shifted into the Instruction block 9 and decoded, the Boundary Scan Sensor IC executes the instruction to shift in data from the JTAG bus to the I/O control circuits 3, shift out captured data onto the JTAG bus by means of the TDO Select and Resync circuit 11, capture data present on the I/O lines into the I/O control circuits 3, or drive data onto the I/O lines by means of the I/O buffers 5. Although many enhancements are possible within the scope of this invention which will be obvious to the reader familiar with the art, these four operations are described in detail later herein by way of example.

Figure 2:
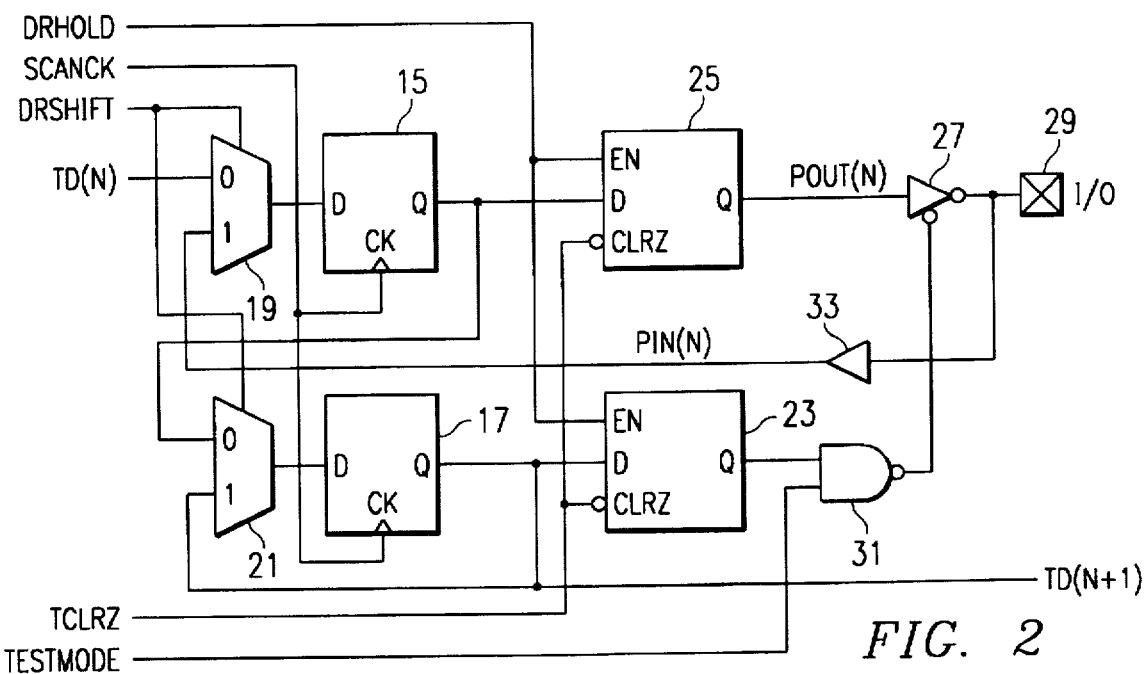
FIG. 2 is a diagram of the I/O pin control circuitry.

FIG. 2 depicts the internal circuitry of the I/O control blocks and the I/O buffer circuitry. Each I/O control block consists of two flip-flop registers and two latches, the data register 15 and data latch 25 and the control register 17 and control latch 23. Additionally, the data and control registers each have an input mux, the data input mux 19 and the control input mux 21. The output of the control latch 23 is gated with the input signal TESTMODE at NAND gate 31, so that the output driver 27 is only enabled when TESTMODE is true and the output of the control latch 23 is true. The output driver 27 is coupled to the I/O terminal pad 29, and the input driver 33 provides a path for data supplied by the device under test back into the scan path via the data input mux 19.

The scan path contains two bits per I/O control block, one for data and one for control. To program a particular pin, the user determines for each test vector whether the pin is to be used as an output or an input, and for an output pin what logic value is to be asserted. These two bits are then shifted into the I/O control block data and control registers 15 and 17 respectively, by use of the DRSHIFT and SCANCK inputs provided by the Test Access Port circuitry in response to commands on the JTAG bus. The TD(N) scan input line

4 is used to couple each I/O control block to the previous one in the scan path, the output of the data register 15 is coupled through the control input multiplexer 21 into the control register 17 and the output of control register 17 is coupled to the TD(N+1) scan output for coupling to the TD(N) input to the next adjacent I/O control block. Once the registers for each I/O control block have been configured properly by means of the scanning operation, the DRHOLD line will become active and those I/O control blocks configured as outputs will supply data from the output latch 25 to the output driver 27, and the control line signal will be provided by control latch 23, through NAND gate 31 to the output enable of the output driver 27. After the test vector has been asserted the DRHOLD line can be used to latch the control bit for the drivers while the next test vector is being scanned into the boundary scan path.

Data may also be captured as input data from the device under test through the input buffer 33, the input multiplexer 19 and into the data register 15 responsive to the SCANCK input. The scanning operation described above is then used to transmit the data captured onto the JTAG bus by means of the TDO Select and Resync block 11 and the TDO output pin (see FIG. 1).

Figure 3:
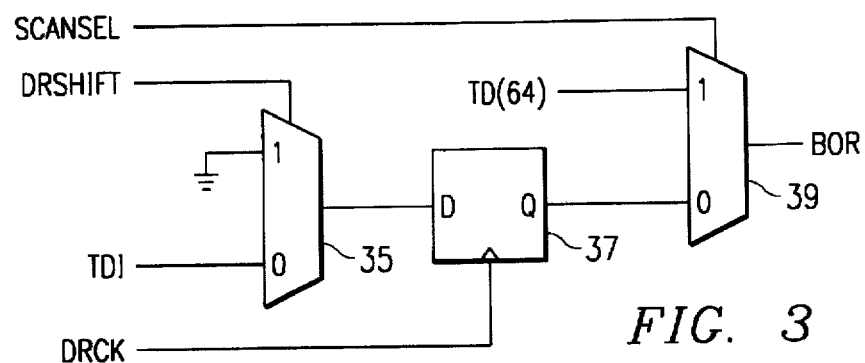
FIG. 3 is a diagram of the bypass circuitry.

FIG. 3 depicts the internal logic used in the JTAG bus required Bypass circuitry 7. The Bypass circuitry 7 consists of a 2-to-1 input multiplexer 35 coupled to a register 37, the output of which is coupled to a 2-to-1 output multiplexer 39.

In operation, the DRSHIFT line controls whether the TDI input is passed into the register 37 through the input multiplexer 35, and the SCANSEL input controls whether the registered data is passed from the register 37 onto the output signal BOR through the output multiplexer 39. When the boundary scan path through the I/O control blocks is in use, the SCANSEL input selects the TD(64) input for the output mux 39, when the Bypass circuit is active the SCANSEL input selects the output of register 37. The BOR signal is coupled to the TDO Select and Resync logic (See FIG. 1) for sourcing the TDO output pin. In this way, a Boundary Scan Driver/Sensor which is not to be used in the current JTAG operation may be bypassed, and the data coming in is shifted through register 37 and out onto the TDO pin for use by devices further along in the JTAG chain.

Figure 4:
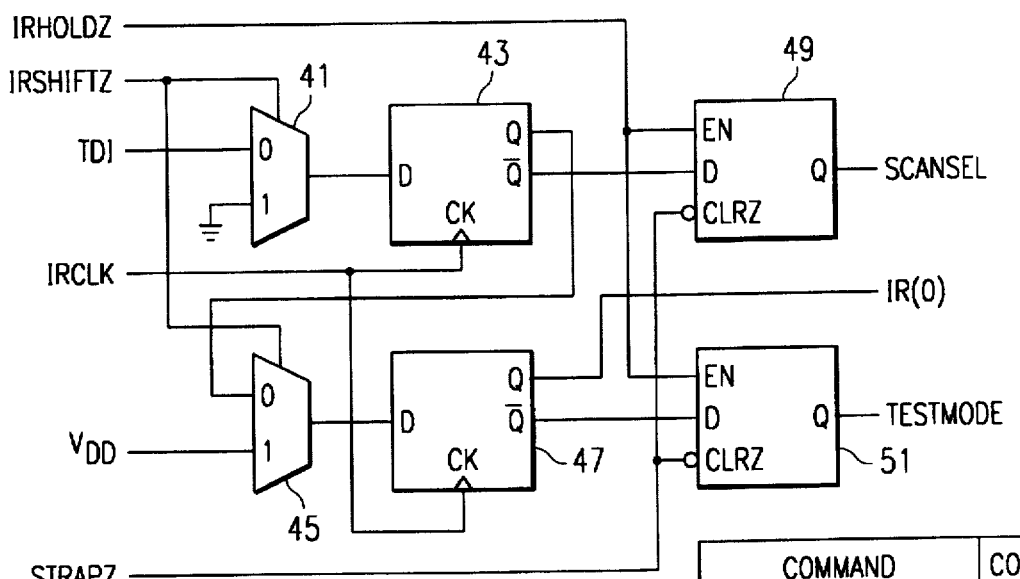
FIG. 4 is a diagram of the instruction decode circuitry.

FIG. 4 depicts the Instruction Register 9 internal circuitry. The Instruction Register in the described preferred embodiment consists of two registers, 43 and 47, serially linked such that the bits supplied by the JTAG data line may be scanned in, two latches 49 and 51 such that the bits scanned in may be passed out as the TESTMODE and SCANSEL control lines, and two input multiplexers 41 and 45 such that the register can be loaded with the default instruction or the incoming instruction can be scanned in. Output IR(0) is coupled to the TDO Select and Resync circuit 11 such that the contents of the register can be read by means of scanning the bits out onto the TDO pin (See FIG. 1).

In operation, the JTAG Test Access Port circuitry 13 controls control lines IRHOLDZ and IRSHIFTZ when the Instruction Register 9 is programmed and used. The input multiplexers 41 and 45 respond to the IRSHIFTZ to enable the TDI serial data to be shifted into the Instruction Register flip-flops 41 and 45. The IRHOLDZ input is asserted to latch the last active instruction in latches 49 and 45. Once loaded, the instruction may be enabled by de-asserting the IRHOLDZ input to allow the new instruction in the registers to be pass through the latches 49 and 51. The new instruction data will then appear at the SCANSEL and TESTMODE outputs which control the logic in the I/O control blocks described above.

Because the Instruction register 9 is two bits wide, it will be readily apparent that there are four different instructions available based on the value of the IR bits 1 and 0. These instructions are EXTEST, ('00'), SAMPLE/PRELOAD ('01'), ASSERT & BYPASS ('10'), and BYPASS ('11'). Each instruction will be described below (the reader should refer to FIG. 2 for details on the circuitry in the I/O Control block, FIG. 3 for the details on the circuitry in the Bypass block, and FIG. 5 for the details of the TDO Select and Resync block).

The EXTEST instruction results in both the SCANSEL and TESTMODE outputs being a logic 1. The SCANSEL output enables the SCANCK signal to the I/O Control blocks, so that the data registers inside the I/O Control Blocks will receive a clock and first sample the input signals and then shift out the sampled values while shifting in a new set of assertion and control bits. The TESTMODE signal, when 1, enables the I/O Control output buffers such that the pins of the device will be driven (if the corresponding output enable bit is also 1).

The SAMPLE/PRELOAD command results in the TESTMODE signal being 0, while the SCANSEL signal is a 1. The output buffers in the I/O Control blocks will again be tristated, while the SCANCK input to the registers in the I/O Control blocks will be enabled, so that the incoming data may be sampled, or the scan path through the I/O Control blocks may be operated to preload the scan path with the next test vector.

The ASSERT & BYPASS command results in the TESTMODE signal being a logic 1, while the SCANSEL signal is a logic 0. The TESTMODE signal will enable the I/O Control blocks which are configured as output enabled drivers to assert the data onto the I/O pins, while the SCANSEL signal value of a logic zero will prevent the registers in the I/O Control blocks from being clocked, so that the values stored there will remain constant. The SCANSEL signal also selects the output of the Bypass Register as the source for the TDO block, so that if the DRSHIFTZ line becomes active during the ASSERT & BYPASS command, the data on the TDO line will be the data shifting through the Bypass register.

The BYPASS command results in the TESTMODE signal being a logic 0, and the SCANSEL signal also being a logic 0. This results in the I/O Control blocks being held at the previous state, as the SCANCK signal is disabled and since the TESTMODE signal is low disabling the output buffers, the outputs are tri-stated. The SCANSEL signal being low enables the output of the Bypass register to appear on the TDO output pin. If a shift operation is begun by the TAP block, the data shifted in on the TDI input will be shifted out onto the TDO output, so that the part is not active in the current JTAG transaction.

The STRAPZ input is asserted by the JTAG TAP logic in response to a reset condition on the JTAG bus to provide the default command, BYPASS, at reset.

Figure 5:
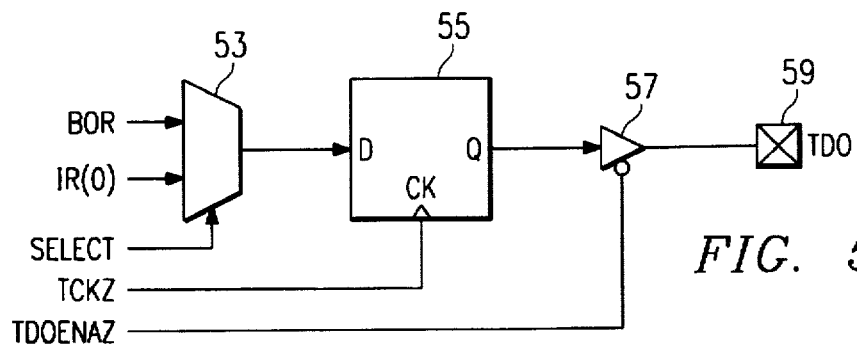
FIG. 5 is a diagram of the TDO Select and Resync circuitry.

FIG. 5 depicts the Test Data Output (TDO) Select and Resync block circuitry. Input multiplexer 53 couples either the output signal from the Bypass register, BOR, or the output signal from the Instruction register, IR(0), to the register 55. Register 55 is clocked with the buffered signal TCKZ, which resynchronizes the operation with the JTAG bus clock, TCK. Output driver 57 is controlled by input TDOENAZ to assert the registered bit onto the JTAG bus for transmission to other devices as signal TDO on pad 59.

FIG. 6 depicts the internal circuitry of the JTAG Test Access Port (TAP) block. The JTAG Test Access Port is a standard part of the Texas Instrument ASIC library used for coupling a JTAG bus to an integrated circuit. The Test Access Port is a state machine implementing the JTAG protocol, and it supplies the control signals STRAPZ, TDOENAZ, SELECT, IRSHIFTZ, IRCK, IRHOLDZ, DRSHIFTZ, DRCK, and DRHOLDZ to the logic blocks described above. The Test Access Port standard cell is described in Appendix D-2 of the Texas Instruments databook entitled "TSC500 Series, 1-um CMOS Standard Cells". This description is incorporated herein by reference.

In Table 1, various configurations of the Boundary Scan Driver/Sensor IC in different packaging and pinout configurations are described. Here, by way of example, a total of 64 I/O control circuits in a single IC is assumed, although larger configurations are possible without hardware modification beyond required fanout buffering for clock and control lines. Many other configurations are possible and within the scope of this invention, as will be apparent to those skilled in the art. The configurations described in Table 1 are merely illustrative and are not meant to limit the scope of the invention.

For example, line 1 of Table 1 describes a 28 pin PDIP package having 18 I/O control block circuits and I/O pins, five pins dedicated to the JTAG bus, two VCC pins and three Gnd pins.

TABLE 1

| Boundary Scan Driver/Sensor IC Configuration | | | | | |
|---|---|---|---|---|---|
| PACKAGE | PINS | I/O | JTAG | VCC | GND |
| PDIP | 28 | 18 | 5 | 2 | 3 |
| PDIP | 40 | 28 | 5 | 3 | 4 |
| PLCC | 28 | 18 | 5 | 2 | 3 |
| PLCC | 44 | 30 | 5 | 4 | 5 |
| PLCC | 68 | 50 | 5 | 5 | 8 |
| PLCC | 84 | 64 | 5 | 5 | 10 |
| PQFP | 80 | 62 | 5 | 5 | 8 |
| PQFP | 100 | 64 | 5 | 15 | 16 |
| PPGA | 100 | 64 | 5 | 15 | 16 |

FIG. 7 depicts the use of the Boundary Scan Sensor/Driver IC's to implement a test fixture of any arbitrary board, system or IC built without JTAG bus capability. Test Control System 85 is a JTAG bus compatible controller which allows the user to communicate with the Boundary Scan ICs 87 using the JTAG bus. Unit under test 89 is the board, system or IC which is to be tested.

In designing a circuit board using parts which do not have JTAG capability, the designer may use as many of the Boundary Scan Sensor/Driver ICs as needed to couple the signals to be tested to a JTAG bus by serially interconnecting the parts into scan paths of the desired lengths as shown in FIG. 7. The JTAG bus may then be used to test and observe the data supplied by and used by these parts. The use of the Boundary Scan Sensor/Driver IC makes it possible to advantageously design a circuit board or system having advanced testability and observability while using existing, non-testable ICs without additional hardware design.

FIG. 7 depicts the use of several Driver/Sensor ICs to implement a JTAG test fixture for any unit for which testability is required, be it a single IC or circuit board or system. The user can create the test fixture simply by coupling multiple Driver/Sensor IC's together until a sufficient number of I/O pins is available, connecting the Boundary Driver IC I/Os to the Unit Under Test, and coupling the JTAG ports of the Boundary Scan Sensor/Driver ICs in parallel on a JTAG bus coupled to the Test Control System.

This allows rapid design of a test fixture using JTAG without additional hardware complexity or design required.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A boundary scan circuit cell suitable for use in a boundary scan test serial scan chain for boundary scan testing of an integrated circuit component having a bidirectional pin, said boundary scan circuit cell comprising:

a bidirectional input-output terminal;

a data scan-in line;

a data scan-out line;

a scan clock line;

a data register shift line;

first and second data registers serially connected between said scan-in and scan-out lines for shifting binary data from said scan-in to said scan-out lines sequentially through said first and second registers in response to clock pulses received from said scan clock line;

an output driver coupled to one of said first and second registers and to said input-output terminal for selectively driving said input-output terminal in accordance with binary data received from said one register in response to an enable signal;

a first multiplexer connected to said one register, said input-output terminal and said data scan-in line, for selectively transmitting either said serially shifted binary data from said scan-in line or a state of said input-output terminal to said one register in accordance with signals received on said data register shift line;

a control circuit coupled to the other of said first and second registers and to said output driver for selectively delivering said enable signal to said output driver in accordance with binary data received from said other register; and a second multiplexer connected to said other register and said one register, for selectively transmitting either serially shifted contents of said one register or contents of said other register to said other register in accordance with said signals received on said data register shift line.

2. A test fixture for boundary scan testing an integrated circuit or circuit board unit under test, comprising:

connection terminals for connection to said unit under test;

a boundary scan signal bus;

a boundary scan driver/sensor integrated circuit, comprising:

a plurality of boundary scan circuit cells as defined in claim 1;

each input-output terminal corresponding to a respective one of said connection terminals, and the data scan-in and data scan-out lines of the plurality of circuit cells being serially connected in a single serial scan chain that enables said serially shifted binary data to be shifted in a single data stream, sequentially through the plurality of circuit cells;

a test data input pin coupled to said boundary scan signal bus;

a test data output pin coupled to said boundary scan signal bus;

a boundary scan test access port circuit coupled to control receipt of the single data stream from the test data input pin to the circuit cells and delivery of the single data stream from the circuit cells to the test data output pin.

3. The circuit of claim 1, further comprising a data register hold line; a first latch connected to receive and latch output from said one register and deliver said latched one register output to said output driver; and a second latch connected to receive and latch output from said other register and deliver said latched other register output as said enable signal to said output driver; said latching operation being under control of signals received from said data register hold line.

4. The circuit of claim 3, further comprising a test mode line, and wherein said control circuit comprises a binary signal logic gate connected between said second latch output and said enable input of said driver.

5. The circuit of claim 4, wherein said gate comprises a NAND gate.

6. The circuit of claim 5, further comprising a buffer connected between said input-output terminal and said first multiplexer.

7. The circuit of claim 6, wherein said registers comprise flip-flop circuits.

8. A boundary scan driver/sensor integrated circuit, comprising:

a plurality of input-output pins;

a plurality of boundary scan circuit cells as defined in claim 1; each input-output terminal corresponding to a respective one of said input-output pins, and the data scan-in and data scan-out lines of the plurality of circuit cells being serially connected in a single serial scan chain that enables said serially shifted binary data to be shifted in a single data stream, sequentially through the plurality of circuit cells;

a test data input pin;

a test data output pin;

a boundary scan test access port circuit coupled to control receipt of the single data stream from the test data input pin to the circuit cells and delivery of the single data stream from the circuit cells to the test data output pin.

9. The boundary scan driver/sensor integrated circuit of claim 8, wherein said test access port circuit comprises circuitry compatible with IEEE 1149.1 JTAG bus standard.

10. The boundary scan driver/sensor integrated circuit of claim 8, further comprising a test data output circuit coupled between the test data output pin and a last of the circuit cells in the serial scan chain; and an instruction register circuit coupled to the test data input pin, test access port circuit, test data output port circuit and circuit cells, and programmable to control functions of the circuit cells and the test data output circuit.

11. The boundary scan driver/sensor integrated circuit of claim 10, further comprising a bypass register coupled to the test data input pin and the test data output port circuit, and operable to selectively pass data from the test data input pin to the test data output port circuit, bypassing the circuit cell serial scan chain.

12. The boundary scan driver/sensor integrated circuit of claim 10, wherein said instruction register circuit further comprises:

first and second memories serially coupled for selectively receiving data on a serial data input;

first and second input multiplexers operable to selectively load serial data or a specified default pattern into said first and second memories; and third and fourth memories coupled to said first and second memories, respectively, and operable to selectively store instruction bits for transmission to other logic circuitry.

13. The boundary scan driver/sensor integrated circuit of claim 8, wherein in each circuit cell said multiplexer is connected to said first register; said first register is a first memory for data storage, and said second register is a second memory for data storage; and said each circuit cell further comprises a third memory for data storage coupled to said first memory and operable to selectively transmit stored data from said first memory to said associated output driver, and a fourth memory coupled to said third memory and operable to selectively transmit stored data from said second memory to said associated output driver for selectively delivering said enabling signal to said associated output driver.

14. The boundary scan driver/sensor integrated circuit of claim 13, wherein said multiplexer comprises a first multiplexer, and each circuit cell further comprises a second multiplexer connected to said second memory and to an output of said second memory, for selectively transmitting either said serially shifted binary data or said contents of said second memory to said second memory responsive to said signals received on said data register shift line.

15. The boundary scan driver/sensor integrated circuit of claim 14, wherein said circuit cells are connected from a lowest to a highest order circuit cell in said serial scan chain; with said first multiplexer of a lowest ordered one of said circuit cells being coupled to selectively receive said single data stream input from said test data input pin; with said first multiplexers of intermediate ordered ones of said circuit cells being respectively coupled to selectively receive said single data stream input from said second memory of a next lower ordered one of said circuit cells; and with said second memory of a highest one of said circuit cells being coupled to transmit output to said test data output pin.

16. A circuit board having boundary scan testability features, comprising:

a first integrated circuit having external connection pins which do not have on-board associated boundary scan testing circuitry;

a boundary scan signal bus; and a boundary scan driver/sensor integrated circuit as defined in claim 8 wherein said test data input pin and said test data output pin are coupled to said boundary scan signal bus.

17. The circuit board of claim 16, wherein said boundary scan signal bus meets the requirements of the IEEE 1149.1 JTAG bus standard.

18. The circuit board of claim 16, wherein said boundary scan test access port circuit comprises circuitry compatible with the IEEE 1149.1 JTAG bus standard.

19. The circuit board of claim 16, further comprising a second integrated circuit having on-board associated boundary scan testing circuitry connected in another serial scan chain; said on-board scan testing circuitry and said boundary scan driver/sensor integrated circuit being coupled, so that said single data stream can be shifted sequentially through both said single serial scan chain and said another serial scan chain.

20. The circuit board of claim 19, wherein said boundary scan driver/sensor integrated circuit further comprises a bypass register operable to selectively transmit boundary scan test data from said boundary scan signal bus, through said bypass register, to said another serial scan chain, without passing through said single scan chain.

21. A boundary scan circuit suitable for use in a boundary scan test of an integrated circuit component having a bidirectional pin, said boundary scan circuit comprising:

a bidirectional input-output terminal;

a data scan-in line;

a data scan-out line;

a scan clock line;

a data register shift line;

first and second data registers serially connected between said scan-in and scan-out lines for shifting binary data from said scan-in to said scan-out lines sequentially through said first and second data registers in response to clock pulses received from said scan clock line;

an output data latch connected to said first register;

an output driver coupled to said output data latch for selectively driving said input-output terminal in accordance with binary data latched in said output data latch received in response to an enable signal;

a first multiplexer connected to said first register, said input-output terminal and said data scan-in line, for selectively transmitting either said serially shifted binary data from said scan-in line or a state of said input-output terminal to said first register;

a control latch circuit coupled to said second data register and to said output driver for selectively delivering said enable signal to said output driver in accordance with binary data latched in said control latch; and a second multiplexer connected to said second register and said first register, for selectively transmitting either data from said first register or data from said second register to said second register.

22. A boundary scan driver/sensor integrated circuit, comprising:

a plurality of input-output pins;

a plurality of input buffers respectively coupled to said input-output pins;

a plurality of output buffers respectively coupled to said input-output pins;

a plurality of input-output pin control circuits each coupled to respective ones of said input and output buffers and each serially coupled to the adjacent input-output control circuits to form a serial scan path, each of said input-output pin control circuits comprising:

(a) data storage circuitry comprising a first multiplexer coupled to selectively receive input data from the respective input buffer, and alternatively to receive serial data in said serial scan path; a first memory coupled to said first multiplexer for capturing said first multiplexer received data; and a second memory coupled to said first memory and operable, when the respective output buffer is enabled, to selectively transmit a test bit of said first memory captured data to the respective output buffer while said first memory is receiving data; and (b) control storage circuitry comprising a second multiplexer operable to receive said first memory captured data in said serial scan path from said first memory of said data storage circuitry; a third memory coupled to said second multiplexer for capturing said second multiplexer received data and operable to output said third memory captured data in said serial scan path, and a fourth memory coupled to said third memory and operable to transmit a control bit of said third memory captured data to control enabling of the respective output buffer while said third memory is receiving or transmitting said second multiplexer received data;

a boundary scan test access port circuit configured to be coupled to an external serial test bus;

a test data output circuit;

an instruction register circuit coupled to the boundary scan test access port circuit and programmable to control the functions of the input-output pin control circuits and the test data output circuit; and operable so that the boundary scan driver/sensor circuit selectively asserts and captures data on the input-output pins responsive to instructions and data supplied on the serial test bus;

wherein said instruction register circuit further comprises:

fifth and sixth memories serially coupled for selectively receiving data on a serial data input;

first and second input multiplexers operable to selectively load serial data or a specified default pattern into said fifth and sixth memories; and seventh and eighth memories coupled to said fifth and sixth memories, respectively, and operable to selectively store instruction bits for transmission to other logic circuitry.

* * * * *